(12) United States Patent
Sasaki et al.

(10) Patent No.: US 11,742,214 B2
(45) Date of Patent: Aug. 29, 2023

(54) PLASMA PROCESSING METHOD

(71) Applicant: HITACHI HIGH-TECH CORPORATION, Tokyo (JP)

(72) Inventors: Junya Sasaki, Tokyo (JP); Masahiro Sumiya, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 15/443,578

(22) Filed: Feb. 27, 2017

(65) Prior Publication Data

US 2018/0082855 A1    Mar. 22, 2018

(30) Foreign Application Priority Data

Sep. 16, 2016   (JP) ................................. 2016-181133

(51) Int. Cl.
    *H01L 21/67*          (2006.01)
    *H01L 21/3213*     (2006.01)
    (Continued)

(52) U.S. Cl.
CPC .... *H01L 21/32136* (2013.01); *C23C 16/4405* (2013.01); *C23C 16/463* (2013.01); *C23C 16/50* (2013.01); *H01J 37/32862* (2013.01); *H01L 21/02071* (2013.01); *H01L 21/67023* (2013.01); *H01L 21/67069* (2013.01)

(58) Field of Classification Search
CPC ......... H01L 21/32136; H01L 21/67023; H01L 21/67069
See application file for complete search history.

(56) References Cited

U.S. PATENT DOCUMENTS

| | | |
|---|---|---|
| 5,817,578 A | 10/1998 | Ogawa |
| 6,319,327 B1 | 11/2001 | Akihiko et al. |

(Continued)

FOREIGN PATENT DOCUMENTS

| | | |
|---|---|---|
| JP | H0542990 A | 2/1993 |
| JP | H0948690 A | 2/1997 |

(Continued)

OTHER PUBLICATIONS

Office Action dated Oct. 3, 2017 for related Taiwanese patent application No. 106102963.

(Continued)

*Primary Examiner* — Shamim Ahmed
(74) *Attorney, Agent, or Firm* — Miles & Stockbridge, P.C.

(57) ABSTRACT

The present invention provides a plasma processing method for subjecting a sample on which a metal element-containing film is disposed to plasma etching in a processing chamber. The method comprises: subjecting an inside of the processing chamber to plasma cleaning using a boron element-containing gas; removing the boron element using plasma after the plasma cleaning; subjecting the inside of the processing chamber to plasma cleaning using a fluorine element-containing gas after removing the boron element; depositing a deposited film in the processing chamber by plasma using a silicon element-containing gas after the plasma cleaning using the fluorine element-containing gas; and subjecting the sample to plasma etching after depositing the deposited film.

10 Claims, 7 Drawing Sheets

(51) Int. Cl.
*C23C 16/46* (2006.01)
*C23C 16/50* (2006.01)
*C23C 16/44* (2006.01)
*H01L 21/02* (2006.01)
*H01J 37/32* (2006.01)

(56) References Cited

U.S. PATENT DOCUMENTS

| | | | |
|---|---|---|---|
| 6,815,362 B1 * | 11/2004 | Wong | H01J 37/32862 134/1.1 |
| 7,204,913 B1 * | 4/2007 | Singh | C23C 16/4404 118/724 |
| 8,557,709 B2 | 10/2013 | Sumiya | |
| 8,767,166 B2 | 7/2014 | Kubota et al. | |
| 8,877,472 B2 | 11/2014 | Medoff | |
| 9,090,972 B2 | 7/2015 | Shareef et al. | |
| 9,721,763 B2 | 8/2017 | Shareef et al. | |
| 2003/0005943 A1 * | 1/2003 | Singh | H01J 37/32935 134/1.1 |
| 2004/0014327 A1 | 1/2004 | Ji et al. | |
| 2004/0069610 A1 | 4/2004 | Arno et al. | |
| 2004/0235303 A1 * | 11/2004 | Wong | H01J 37/32862 438/689 |
| 2011/0114130 A1 | 5/2011 | Kang et al. | |
| 2011/0265813 A1 * | 11/2011 | Okai | H01J 37/32926 134/1.1 |
| 2013/0087174 A1 * | 4/2013 | Sun | B08B 5/00 134/30 |
| 2014/0166049 A1 | 6/2014 | Kang et al. | |
| 2017/0194561 A1 * | 7/2017 | Suyama | B08B 7/0035 |

FOREIGN PATENT DOCUMENTS

| | | |
|---|---|---|
| JP | H11-168092 A | 6/1999 |
| JP | 2000150387 A | 5/2000 |
| JP | 2001-044186 A | 2/2001 |
| JP | 2008-053456 A | 3/2008 |
| JP | 2008-060171 A | 3/2008 |
| JP | 2011-100820 A | 5/2011 |
| JP | 2011-192872 A | 9/2011 |
| JP | 2016-066801 A | 4/2016 |
| KR | 10-2011-0054287 A | 5/2011 |
| TW | 504102 A | 9/2002 |
| TW | 200402458 A | 2/2004 |
| TW | 201207520 A1 | 2/2012 |
| TW | 201717277 A | 5/2017 |
| TW | I609444 A | 12/2017 |

OTHER PUBLICATIONS

Office Action dated Feb. 9, 2018 for Korean Patent Application No. 10-2017-0004059.
Search Report dated Aug. 3, 2021 in International Application No. PCT/JP2021/020226.
Written Opinion dated Aug. 3, 2021 in International Application No. PCT/JP2021/020226.
Search Report dated Aug. 17, 2021 in International Application No. PCT/JP2021/023318.
Written Opinion dated Aug. 17, 2021 in International Application No. PCT/JP2021/023318.
Office Action dated Nov. 22, 2022 in Taiwanese U.S. Appl. No. 11/106,138.
Office Action dated Mar. 24, 2023 in U.S. Appl. No. 17/435,127.

* cited by examiner

PLASMA PROCESSING METHOD

BACKGROUND OF THE INVENTION

1. Field of the Invention

The present invention relates to a plasma processing method which is suitable for subjecting a semiconductor substrate or the like to a surface processing using plasma.

2. Description of the Related Art

A metal material such as titanium nitride (TiN) or lanthanum (La) is used as a metal film having a proper work function between a polysilicon electrode and $HfO_2$ in a fine gate structure with an improvement in the performance of a semiconductor device.

When a sample containing the metal material (for example, TiN) is etched, a metal material residue (metal residue) may be deposited on an inner wall of a chamber, which complicates the removal of the metal material residue provided by plasma cleaning. As described in JP-2011-192872-A, a technique of previously subjecting an inner wall of a processing chamber before etching to coating using a silicon element-containing gas, and thereafter etching a metal material to prevent a metal residue from being directly deposited on the inner wall of the processing chamber has been known as a technique of solving such a problem.

SUMMARY OF THE INVENTION

In the manufacture of a current generation device, as shown in JP-2011-192872-A, the metal material-containing sample is subjected to plasma etching, and plasma cleaning is then carried out using a nitrogen trifluoride gas in which the sample is subjected to metal cleaning using a mixture gas containing a chlorine gas and a boron trichloride gas to remove a silicon-containing film. This can provide stable desired etching processing results having no change in a lot.

However, when a continuous processing is performed in the case of the manufacture of a next generation device, as shown in JP-2011-192872-A, the etching rate of TiN is disadvantageously decreased with an increase in the number to be treated as shown in FIG. 6 to be described later. In the continuous processing, the sample containing the metal material is subjected to plasma etching, and the plasma cleaning is then carried out using a nitrogen trifluoride gas in which the sample is subjected to metal cleaning using a mixture gas containing a chlorine gas and a boron trichloride gas to remove a silicon-containing film. The phenomenon is presumed to occur as follows.

In a plasma processing in which metal cleaning is carried out using a mixture gas containing a chlorine gas and a boron trichloride gas after a workpiece having a metal element-containing film is etched as shown in JP-2011-192872-A, and plasma cleaning is succeedingly carried out using a fluoride-containing gas after the metal cleaning, a boron nitride-based reaction product is generated in the processing chamber, and the reaction product remains in the chamber.

When the boron element-containing deposited material remaining in the chamber is taken into a coating film, the boron element-containing deposited material when the next workpiece is etched is loose, and deposited on the surface of the workpiece. It is considered that the deposition of the boron element-containing deposited material to the surface of the workpiece decreases the etching rate, which causes the change of CD measurement and the generation of a foreign substance.

Because of this, the boron nitride-based reaction product generated in the processing chamber is considered to influence the etching rate of TiN, which makes it necessary to suppress the generation of the boron nitride-based reaction product. In order to suppress the generation of the boron nitride-based reaction product, it is necessary to remove a boron component between the metal cleaning by the boron element-containing gas and the plasma cleaning containing the fluorine element. However, this is not disclosed and suggested in prior art literatures such as JP-2011-192872-A.

Because of this, the present invention provides a plasma processing method which can suppress the change of plasma etching performance.

The present invention provides a plasma processing method for subjecting a sample on which a metal element-containing film is disposed to plasma etching in a processing chamber. The method comprises: subjecting an inside of the processing chamber to plasma cleaning using a boron element-containing gas; removing the boron element using plasma after the plasma cleaning using the boron element-containing gas; subjecting the inside of the processing chamber to plasma cleaning using a fluorine element-containing gas after removing the boron element; depositing a deposited film in the processing chamber by plasma using a silicon element-containing gas after the plasma cleaning using the fluorine element-containing gas; and subjecting the sample to plasma etching after depositing the deposited film in the processing chamber.

The present invention can suppress the change of plasma etching performance.

DESCRIPTION OF THE PREFERRED EMBODIMENTS

Hereinafter, one Example of the present invention will be described with reference to the drawings.

Figure 1:
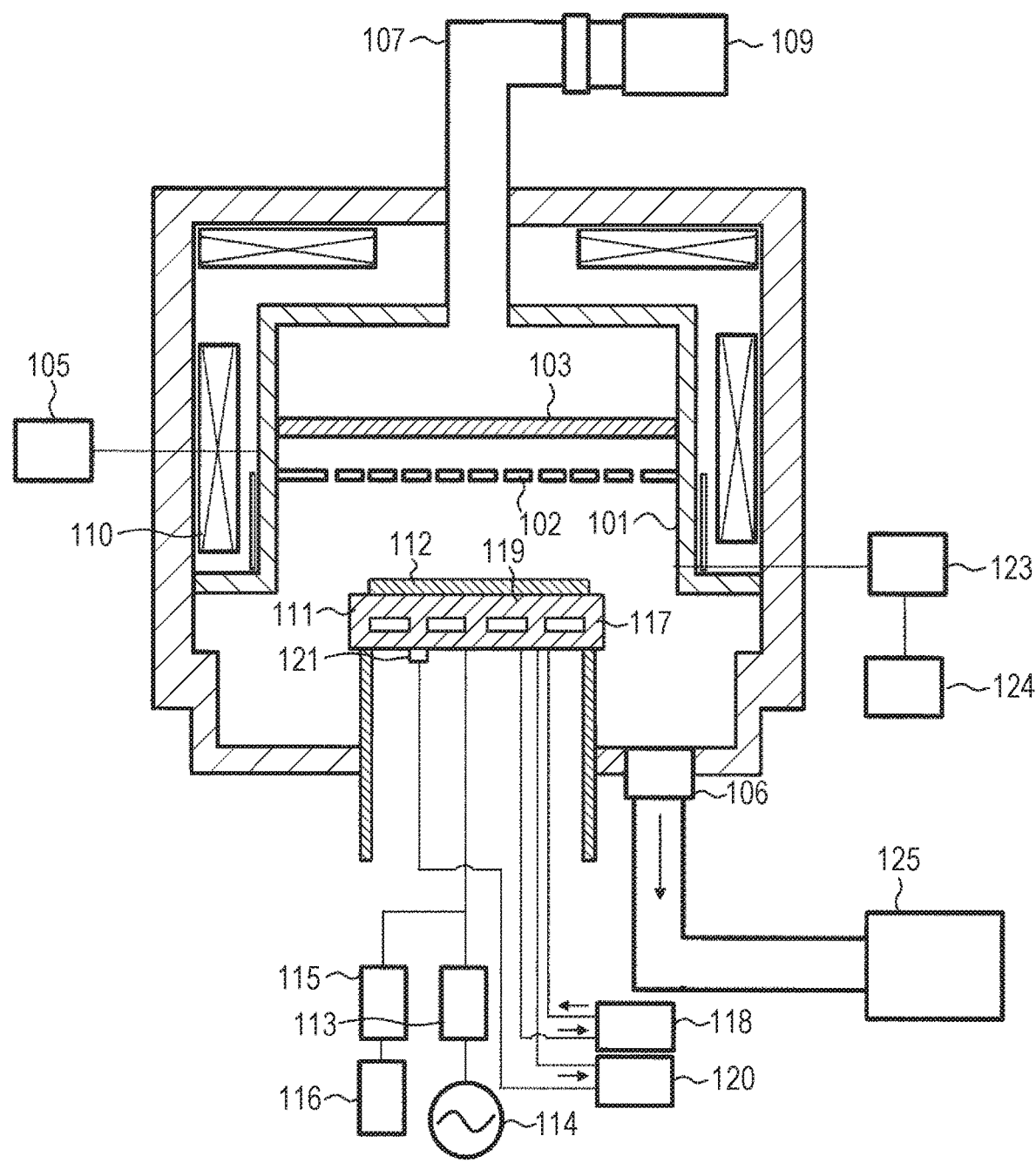
FIG. 1 is a schematic longitudinal sectional view of the constitution of a plasma processing apparatus used for one Example of the present invention.

First, a plasma processing apparatus used for one Example of the present invention will be described with reference to FIG. 1. FIG. 1 is a schematic longitudinal sectional view of the constitution of a plasma etching apparatus with microwave electron cyclotron resonance (ECR) as a plasma source.

A shower plate 102 (for example, made of quartz or yttria) and a dielectric window 103 made of quartz are disposed at an upper part of a processing chamber 101 having a substantially cylindrical shape and opened upwards. The shower plate 102 has a circular disk shape having a plurality of introduction holes introducing an etching gas and arranged uniformly about a central portion.

A gas supply device 105 for flowing the etching gas is connected to the shower plate 102. A processing gas is supplied to a space between the shower plate 102 and the dielectric window 103 thereabove from the gas supply device 105. The processing gas is supplied into the processing chamber 101 via the space and the introduction holes of the shower plate 102. Furthermore, a vacuum evacuation device 125 is connected to a lower bottom part of the processing chamber 101 via a vacuum evacuation opening 106.

On the other hand, in order to transmit electric power for generating plasma to the processing chamber 101, a waveguide 107 for transmitting an electromagnetic wave is disposed above the dielectric window 103. The electromagnetic wave transmitted to the waveguide 107 is oscillated by an electromagnetic wave generation power source 109, and supplied into the waveguide 107. In the present Example, a microwave at 2.45 GHz is used as the electromagnetic wave. A magnetic field generation coil 110 for forming a magnetic field is disposed on the outside of the processing chamber 101 so as to surround the processing chamber 101.

The electric field oscillated by the electromagnetic wave generation power source 109, and transmitted into the processing chamber 101 via the waveguide 107, the dielectric window 103, and the shower plate 102 interacts with the magnetic field formed by the magnetic field generation coil 110 to dissociate the processing gas supplied into the processing chamber 101, thereby generating high-density plasma. At a lower part of the inside of the processing chamber 101, a sample stage 111 having an upper surface on which a semiconductor workpiece 112 corresponding to a sample is placed is disposed so as to be opposed to the shower plate 102.

The sample stage 111 is substantially cylindrical, and has an upper surface covered with a flame-coating film (not shown) formed by flame-coating a ceramic material such as aluminum oxide or yttrium oxide to the upper surface. Furthermore, a film-like electrode (not shown) made of a metal member is disposed in the flame-coating film. A DC voltage is applied to the electrode from a DC power supply 116 via a radio frequency filter 115. A radio frequency electromagnetic power supply 114 is connected to a metal block disposed in the sample stage 111 via a matching circuit 113, and the block operates as a radio frequency electrode.

A concentric or spiral coolant conduit 117 which passes flow of a medium for controlling temperatures inside the block is disposed in the block of the electrode in the sample stage 111. The coolant conduit 117 is connected to a temperature controller 118 via pipes disposed on the outside of the sample stage 111. A heater 119 is disposed at the upper part in the block of the electrode, and is connected to a heater controller 120. Furthermore, a temperature sensor 121 is disposed on the sample stage 111, and controls the heater controller 120 and the temperature controller 118 for controlling a coolant temperature on the basis of a signal output from the temperature sensor 121 so as to set temperatures of the sample stage 111 and the workpiece 112 to desired values.

The workpiece 112 is placed on the upper surface of the sample stage 111 by a transfer device (not shown) such as a robot arm, and then electrostatically adsorbed to the flame-coating film on the sample stage 111 under the influence of an electrostatic force of a DC voltage applied from the DC power supply 116. In this case, a gas having heat conductivity is supplied to a space between the rear surface of the workpiece 112 and the flame-coating film to expedite heat conduction between the workpiece 112 and the sample stage 111, and thereby the temperature of the workpiece 112 is controlled to a desired value at a high speed. In this state, a desired processing gas is supplied by the gas supply device 105, and plasma is then generated in the processing chamber 101 while the pressure inside the processing chamber 101 is set to a predetermined value.

Then, the radio frequency electromagnetic power is supplied from the radio frequency electromagnetic power supply 114 connected to the sample stage 111 to form a bias potential above the flame-coating film, and thereby ions are attracted from plasma to the workpiece 112 so as to etch the workpiece 112. Furthermore, a spectroscope 123 for detecting emission during the plasma processing is connected to a sidewall of the processing chamber 101. An output detected from the spectroscope 123 is transmitted to an emission data processing device 124 connected to the spectroscope 123. A calculator inside the emission data processing device 124 performs the analysis of emission data, or the like.

Figure 2:
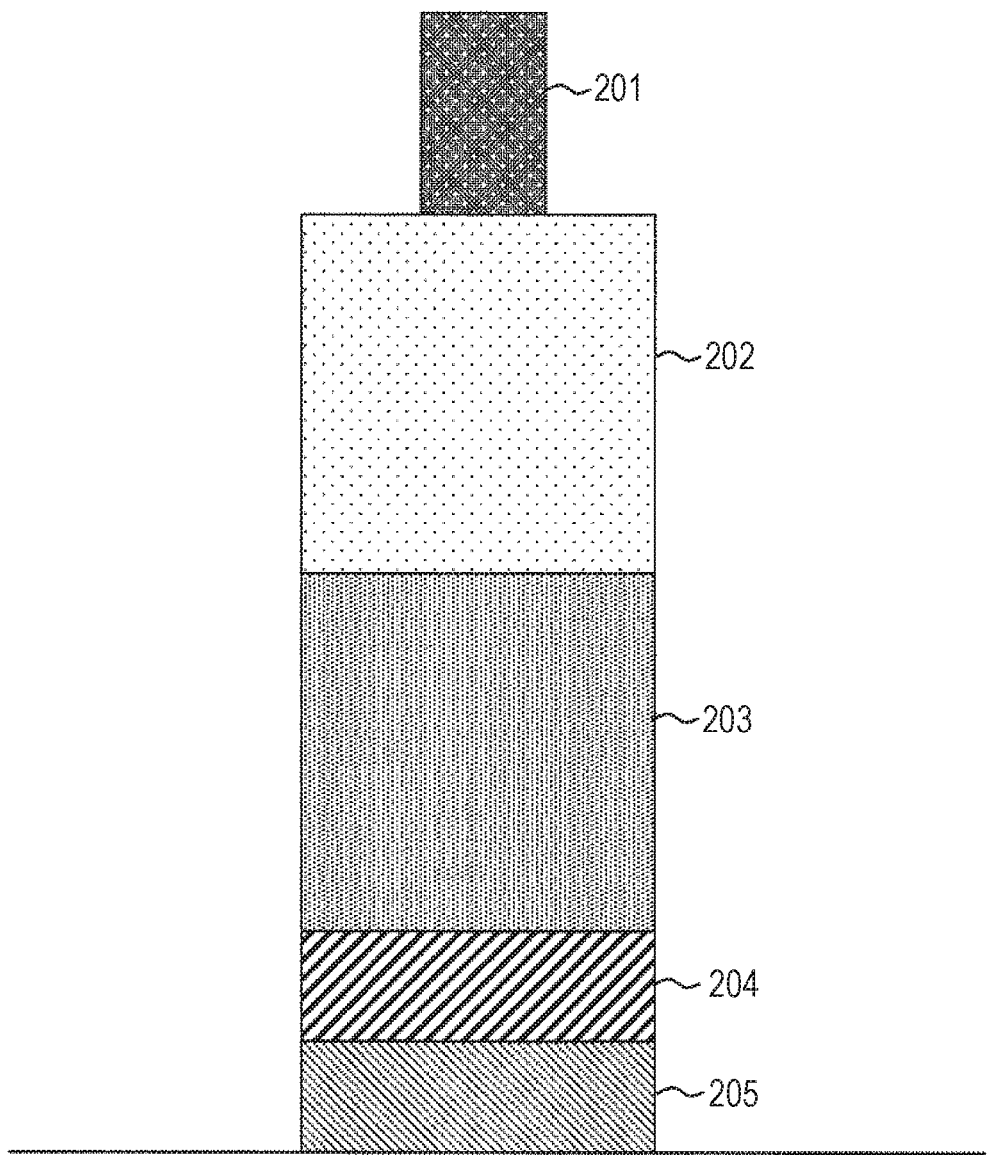
FIG. 2 shows an example of the structure of a workpiece according to one Example of the present invention.

Next, the schematic structure of the workpiece 112 subjected to the plasma processing in the present Example will be described using FIG. 2. As shown in FIG. 2, in the structure of the workpiece 112, a resist mask 201 (Photo Resist Mask: PR Mask), a hard mask 202, a polysilicon (Poly-Si) film 203, a metal film 204 (TiN in the case of the present Example), and a high-k film (HfO$_2$ in the case of the present Example) 205 are disposed on a silicon substrate (not shown) from top to bottom in this order. Herein, the hard mask 202 is a film using a material such as carbon, SiO$_2$, SiN or SiON, or containing it as a principal material.

The kind of the material of the metal film 204, the number of stacking, and the thickness differ depending on a device structure, an NMOS portion, and a PMOS portion. In order to form a circuit of a semiconductor device, particularly, a gate structure and a wiring structure, the film structures are required to be etched into a predetermined shape.

In the present Example, the respective films are treated according to different etching recipes. When the mask portion requires its film thickness corresponding to recent fine working and its etching resistance properties as a mask, amorphous carbon (ACL) and the hard mask 202 or a mask having a multilayer mask structure including a mixture thereof which underlie the resist film 201 may be adopted as the mask of the present Example. Herein, the description for the formation of the mask 201 by etching will be omitted.

Next, a plasma processing method for the above-mentioned workpiece will be described with reference to FIG. 3.

Figure 3:
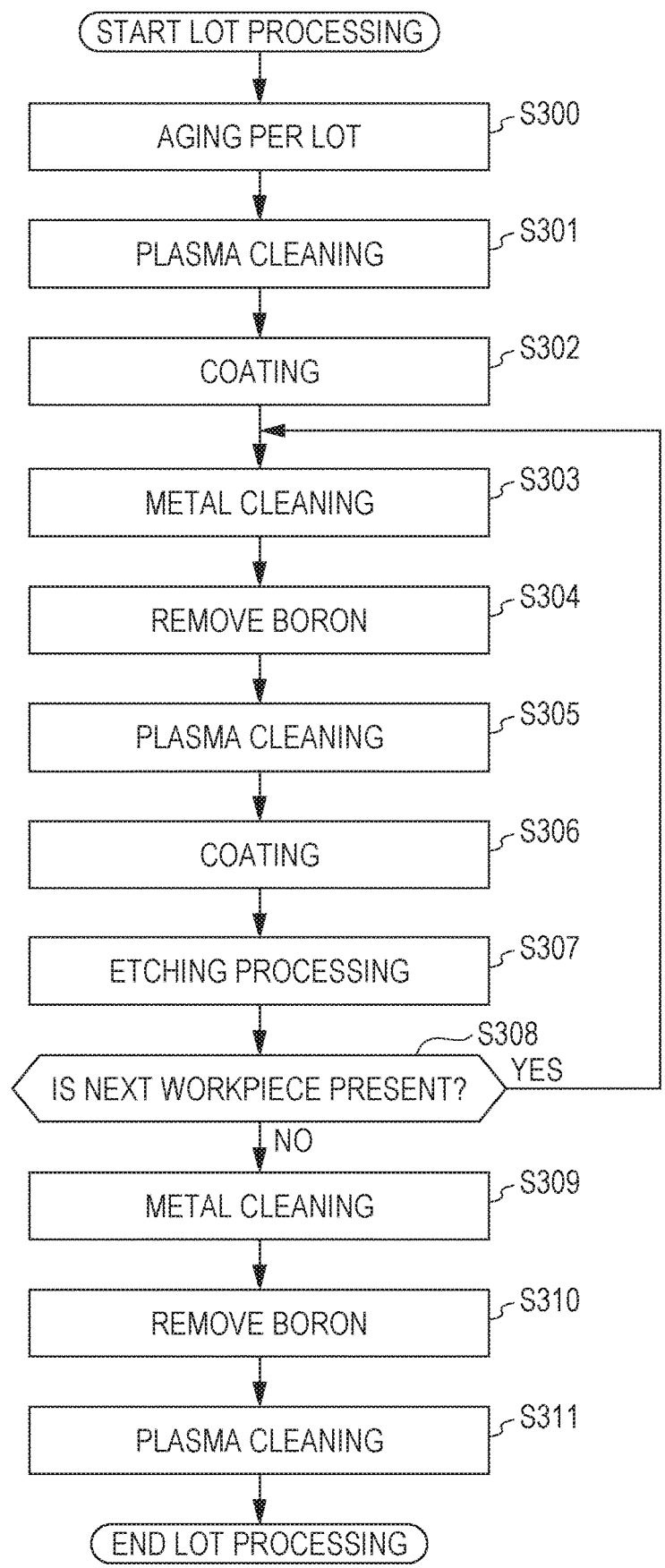
FIG. 3 is a flow diagram showing a plasma processing method of one Example of the present invention.

FIG. 3 is a flowchart showing the flow of a plasma processing for the workpiece. In FIG. 3, an example is shown in which a predetermined number of workpieces stored in a container capable of housing workpieces such as a cassette are handled as one lot and per lot, a processing is started from an aging processing (step 300) for placing the surface of members disposed in the processing chamber 101 in a state suitable for the plasma processing. In the aging processing, plasma is formed by introducing a predetermined gas in a state where the workpiece 112 is not disposed in the processing chamber 101 in order that the temperature and roughness of the surface of the members, and the quality of a material of the members, or the like in the processing chamber 101 are adjusted so as to be placed in a state suitable for the plasma processing of the workpiece 112 to be performed subsequently.

Then, in step 301, plasma is formed by introducing a mixture gas containing an $NF_3$ gas and an Ar gas as a cleaning gas into the processing chamber 101, and a plasma cleaning processing is performed for eliminating particles, coatings, and deposited materials deposited and remaining on the surface inside the processing chamber 101. When a first workpiece of the lot is treated, the inside of the processing chamber 101 is subjected to plasma cleaning in a state where the particles, the coatings, and the deposited materials deposited and remaining on the surface inside the processing chamber 101 are absent. Then, in step 302, the inner surface of the processing chamber 101 subjected to the plasma cleaning processing to be in a cleaned state is subjected to a coating processing to deposit a deposited film to be described later in order to stabilize the characteristics of an etching processing.

The members disposed in the processing chamber 101, for example, the surface of the inner side sidewall of the processing chamber 101, and the upper and side surfaces of the sample stage 111 are covered with a deposited film made of a material containing Si or SiO according to the coating processing of the present Example. The coating processing is performed for the purpose of covering (coating) the surface of the inner wall of the processing chamber 101 facing the plasma with a deposited film made of a predetermined material before the workpiece 112 is treated in order to suppress the change of etching performance since the characteristics and results of the processing of the workpiece 112 are influenced by the change of the state of the inner wall of the processing chamber 101.

However, when the film having the above-mentioned structure is etched, the kind of etching gas system to be used differs according to the kind of the film, and in some cases, the film deposited on the inner wall of the processing chamber 101 disappears, and the inner wall is exposed. For this reason, a deposited film covering the inner surface of the processing chamber 101 (coating film) desirably remains on the inner surface of the processing chamber 101 until the processing of a target film is ended or at least during the step of switchover of the film, in etching the plurality of films of the above-mentioned film structure.

For this reason, a film thickness equal to or greater than a film thickness exhausted during the etching processing of the workpiece 112 is previously deposited in the coating processing of step 302. Furthermore, in the etching processing of the above-mentioned film structure, plasma generated by supplying a fluorine element-containing gas or a chlorine element-containing gas or the like as a processing gas is used, and thereby the deposited film is required to have high plasma resistance properties against the plasma of this kind.

Particularly, in the case of the silicon element-containing deposited film, a film containing a silicon element and an oxygen element and a film containing a silicon element and a carbon element have each good plasma resistance properties. As the gas kind of a processing gas for forming plasma for depositing the deposited film on the surface of members inside the processing chamber 101, a mixture gas containing an $SiCl_4$ gas and an $O_2$ gas, or a mixture gas containing an $SiCl_4$ gas and a $CH_4$ gas, for example, is suitable. By adding a dilution gas such as Ar to the mixture gases, a similar deposited film can also be formed.

Next, in step 303, a metal cleaning processing is carried out using plasma generated by a boron element-containing gas to remove the material containing the metal contained in the deposited film and derived from the component of the metal film 204, thereby removing a metal content remaining in the processing chamber 101. When the first workpiece of the lot is treated, the metal cleaning is carried out in a state where the material containing the metal derived from the component of the metal film 204 in the processing chamber 101 does not remain. The boron element-containing gas is a gas such as a $BCl_3$ gas, a $BF_3$ gas, or a $BBr_3$ gas.

Usually, in the case of a metal, for example, in the present Example, the Ti-based reaction product remains in the form of strong bonds such as Ti—O and Ti—F, and is therefore difficult to eliminate with only a conventional plasma processing using a fluoride-containing gas or a $Cl_2$ gas. For this reason, in the above-mentioned metal cleaning, a gas containing, for example, a boron trichloride ($BCl_3$) gas or the like is supplied as a gas having high reduction properties. Plasma is generated by mixing the gas exhibiting reduction properties such as a boron trichloride gas with chlorine (Cl) or fluoride (F) and supplying the mixture gas into the processing chamber 101, and thereby the metal-containing material remaining in the processing chamber 101 is removed.

As examples of the processing gas used for the metal cleaning processing, an HCl gas, an $SiCl_4$ gas, a $BCl_3$ gas, a mixture gas containing a $CH_4$ gas and a $Cl_2$ gas, or a mixture gas containing a $CH_4$ gas and a gas containing F ($SF_6$ gas, $CF_4$ gas, CxHyFz gas or the like) can be conceived. Particularly, a mixture gas containing a $BCl_3$ gas and a $Cl_2$ gas has a high Ti cleaning effect, and the mixture gas containing a $BCl_3$ gas and a $Cl_2$ gas is used in the metal cleaning processing of the present Example.

Then, a metal cleaning processing is carried out until the substance amount of the metal component remaining in the processing chamber 101 and particularly combined with the component of the deposited film or the component of the workpiece 112 to be present in the deposited film is sufficiently decreased, and cleaning is then performed using a chlorine gas, to remove the boron element-containing compound remaining in the processing chamber 101 in step 304. When the first workpiece of the lot is treated, the boron element-containing compound is not a compound between a component of a boron element-containing gas and a reaction product generated by etching the workpiece.

Cleaning for removing the boron element-containing compound (boron removing processing) is carried out until the amount of the boron element-containing compound remaining in the processing chamber is sufficiently decreased. Furthermore, the terminal point of the boron removing processing can be detected by using the luminescence obtained from the plasma in the boron removing processing.

Then, after the boron removing processing (step 304), a plasma cleaning processing for removing the deposited film and the other reaction product remaining in the processing chamber 101 is performed in step 305. When the first workpiece of the lot is treated, the reaction product does not remain in the processing chamber 101. The plasma cleaning has the same plasma processing condition as that of the plasma cleaning in step 301.

When the deposited film is a film made of a component containing Si, and, for example, the plasma processing for forming the deposited film is carried out using a mixture gas containing a $SiCl_4$ gas and an $O_2$ gas, or a mixture gas containing an $SiCl_4$ gas, an $O_2$ gas, and an Ar gas, plasma is generated using a gas containing fluoride (F) or containing fluoride (F) and oxygen (O) as components as a processing gas, and the plasma cleaning processing is carried out using the generated plasma. As the gas used for the plasma cleaning, an $SF_6$ gas, an $NF_3$ gas, and a mixture gas containing the gases and an $O_2$ gas, or the like are suitable, for example.

Next, in step 306, a coating processing is performed under the same plasma processing condition as that of the coating processing in step 302 after the end of the plasma cleaning in step 305. After the end of the coating processing, in step 307, the workpiece 112 is placed on the sample stage 111 using a transfer device (not shown) such as a robot arm. The workpiece 112 is placed on the sample stage 111, and the workpiece 112 is then subjected to an etching processing under a predetermined plasma etching condition. After the etching processing of the workpiece 112, the workpiece 112 is taken out from the processing chamber 101.

After the workpiece 112 subjected to the etching processing is taken out from the processing chamber 101, a control device (not shown) included in the plasma processing apparatus shown in FIG. 1 determines whether the etching processing of the workpiece 112 is continued based on information on the presence or absence of the workpiece 112 to be then treated in step 308. Next, when the control device determines that the workpiece 112 to be treated is present, the program returns to step 303 in order to subject the next workpiece to an etching processing, and then sequentially carries out steps 304 to 308.

When the next workpiece 112 to be treated is absent, metal cleaning is carried out under the same plasma processing condition as that of the metal cleaning in step 303 in step 309 in order to end the lot processing during the plasma processing. After the end of the metal cleaning, plasma cleaning for removing the boron element-containing compound is carried out under the same plasma processing condition as that of the plasma cleaning in step 304 in step 310.

Finally, after the end of the plasma cleaning for removing the boron element-containing compound, plasma cleaning is carried out under the same plasma processing conditions as those of the plasma cleanings in steps 301 and 305 in step 311. After the end of the plasma cleaning, the workpiece 112 subjected to the etching processing is sometimes on the way of transfer. Therefore, when the above-mentioned controller recognizes that the workpiece 112 is housed at the original position in the original cassette, the controller causes reporting means (not shown) such as a display monitor, buzzer or light included in the plasma processing apparatus shown in FIG. 1 to report the end of the lot processing during the plasma processing.

Figure 4:
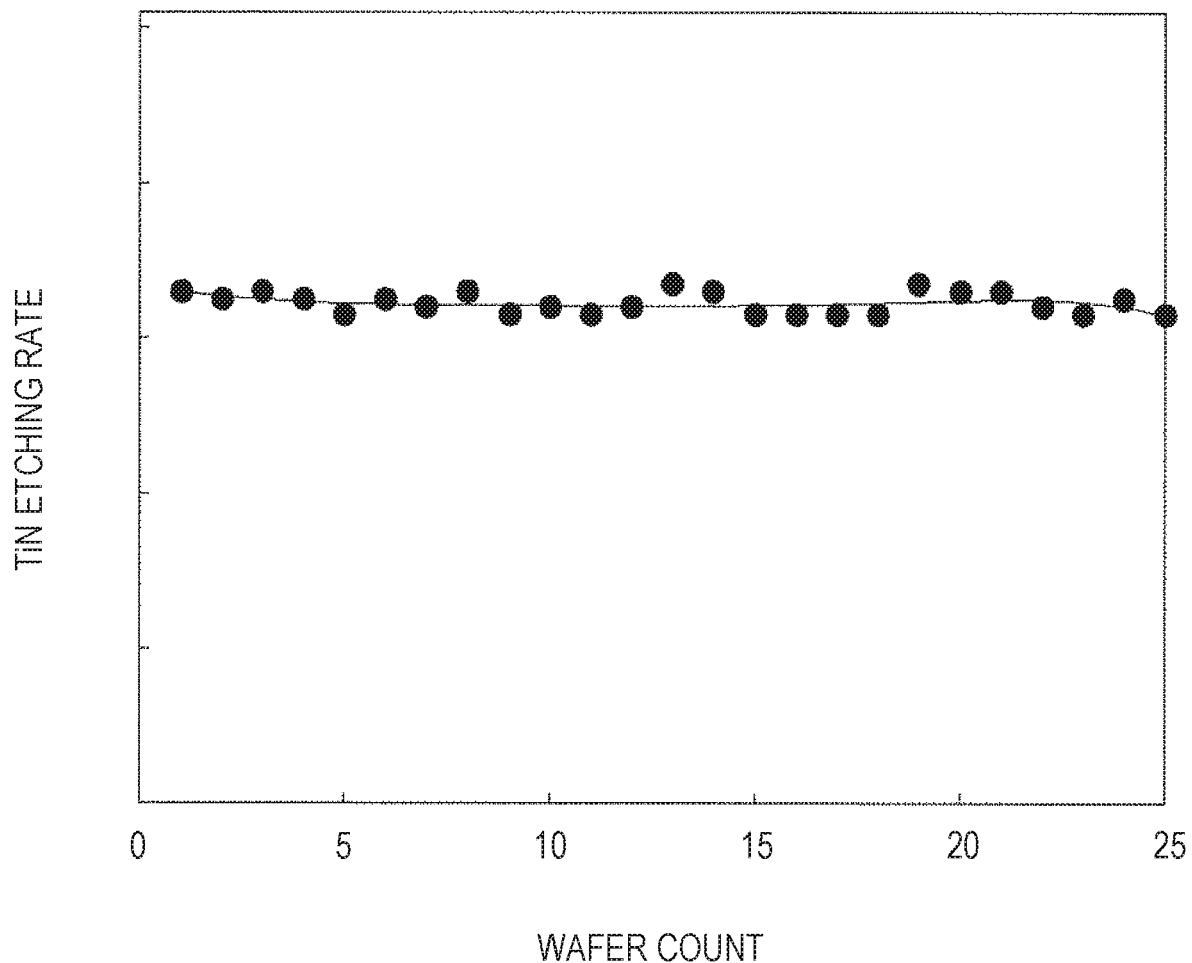
FIG. 4 shows the transition of the etching rate of a TiN film showing the effect of the present invention.

Next, according to the flow of the plasma processing shown in FIG. 3 described above, the transition of the etching rate of each TiN film when the twenty five workpieces each including the TiN film are subjected to an etching processing is shown in FIG. 4. By performing the plasma processing according to the flow of the plasma processing shown in FIG. 3, the transition of the etching rate of each TiN film as shown in FIG. 4 is accordingly stabilized.

Figure 5:
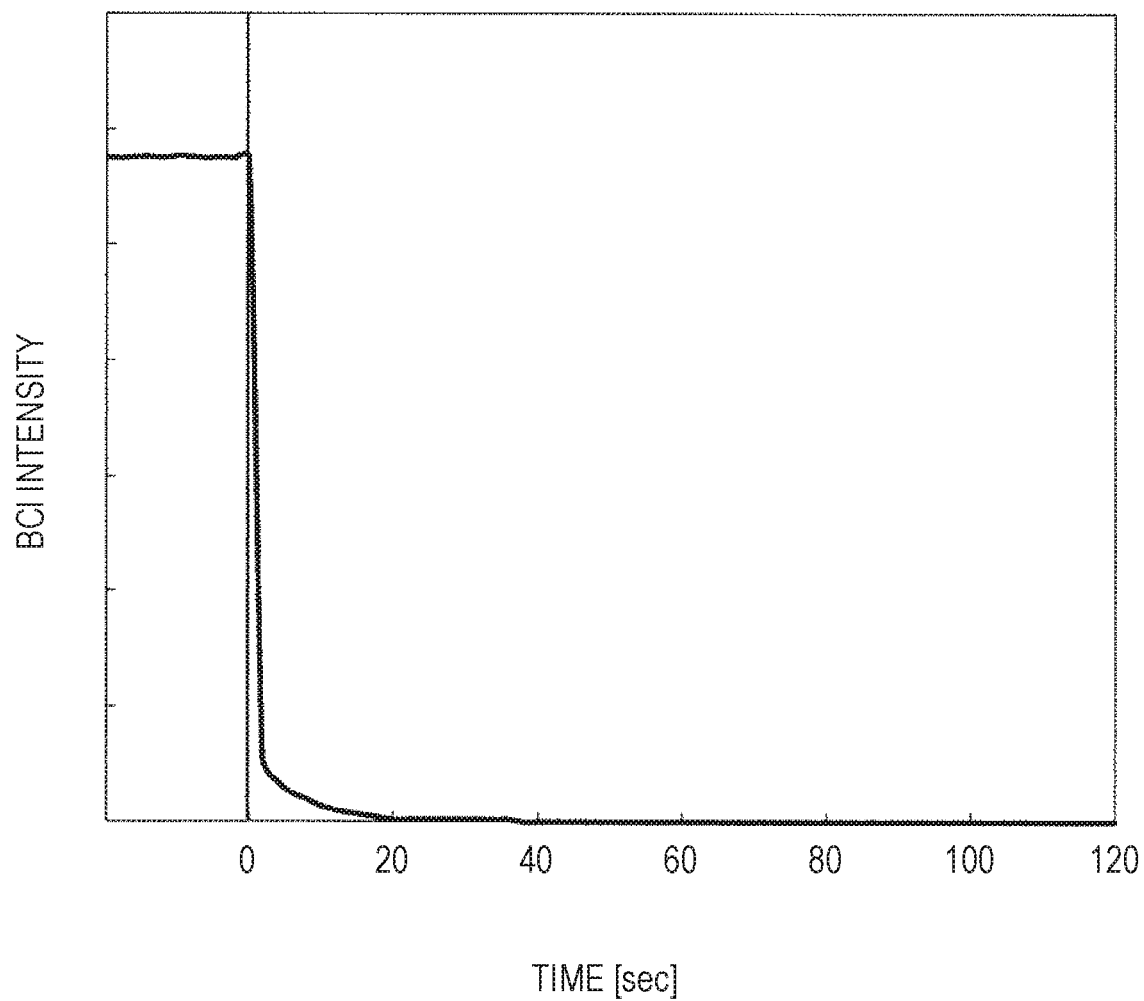
FIG. 5 shows the time transition of the luminescence intensity of BCl according to the plasma processing method of FIG. 3.

FIG. 5 shows the time transition of the luminescence intensity of BCl during plasma cleaning (steps 304 and 310) for removing a boron element-containing compound after metal cleaning using a mixture gas containing a chlorine gas and a boron trichloride gas. As shown in FIG. 5, the luminescence intensity of BCl is rapidly decreased immediately after carrying out plasma cleaning (steps 304 and 310) for removing the boron element-containing compound to remove the boron element-containing compound, and is generally undetected in 20 to 30 seconds.

Figure 6:
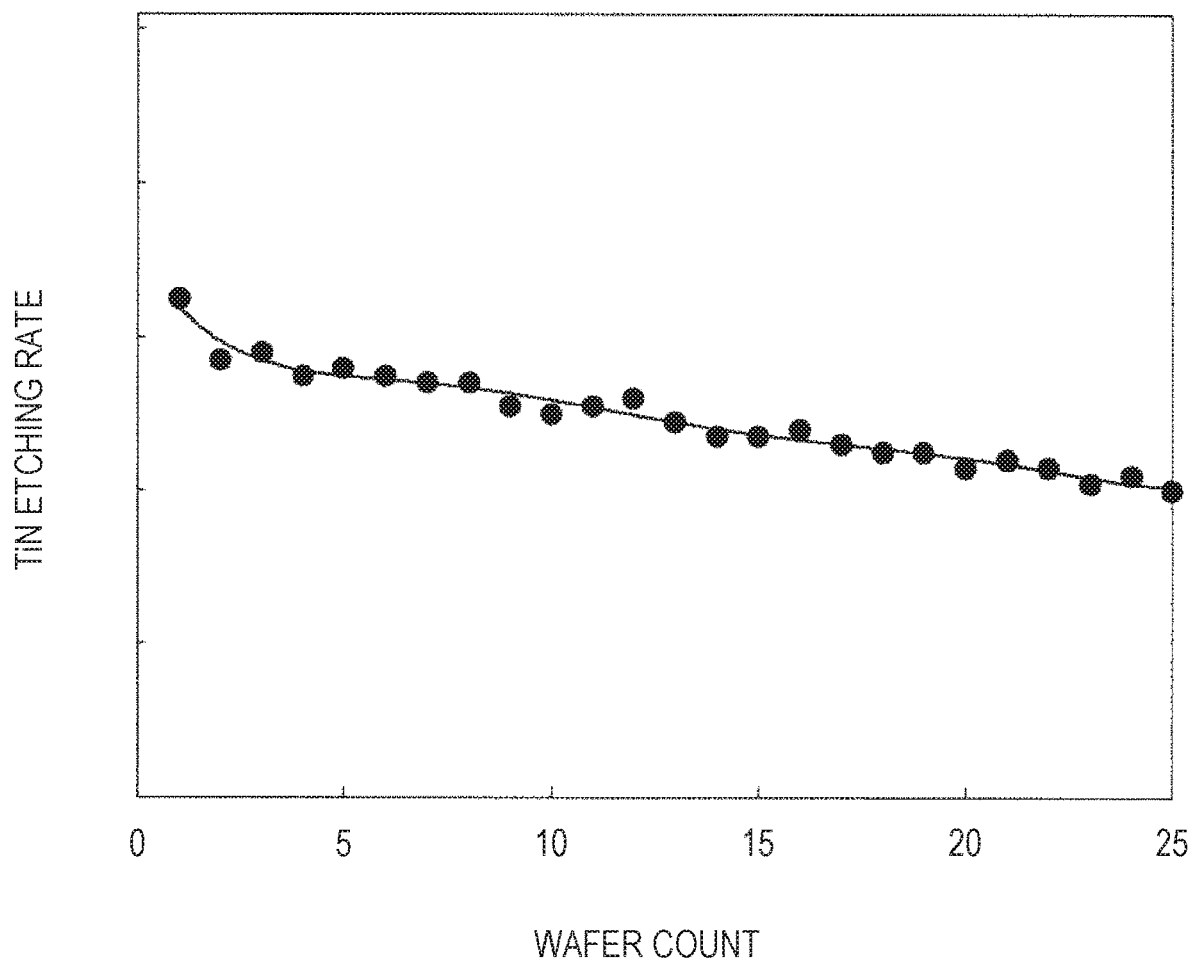
FIG. 6 shows the transition of the etching rate of a TiN film according to a conventional plasma processing method.

On the other hand, from the plasma processing flow shown in FIG. 3, in the transition of the etching rate of each TiN film when the twenty five workpieces each including the TiN film are subjected to an etching processing according to the flow of the plasma processing except "plasma cleaning (steps 304 and 310) for removing a boron element-containing compound", the etching rate of the TiN film is decreased with the increase in the number to be treated of the workpieces each including the TiN film, as shown in FIG. 6.

Figure 7:
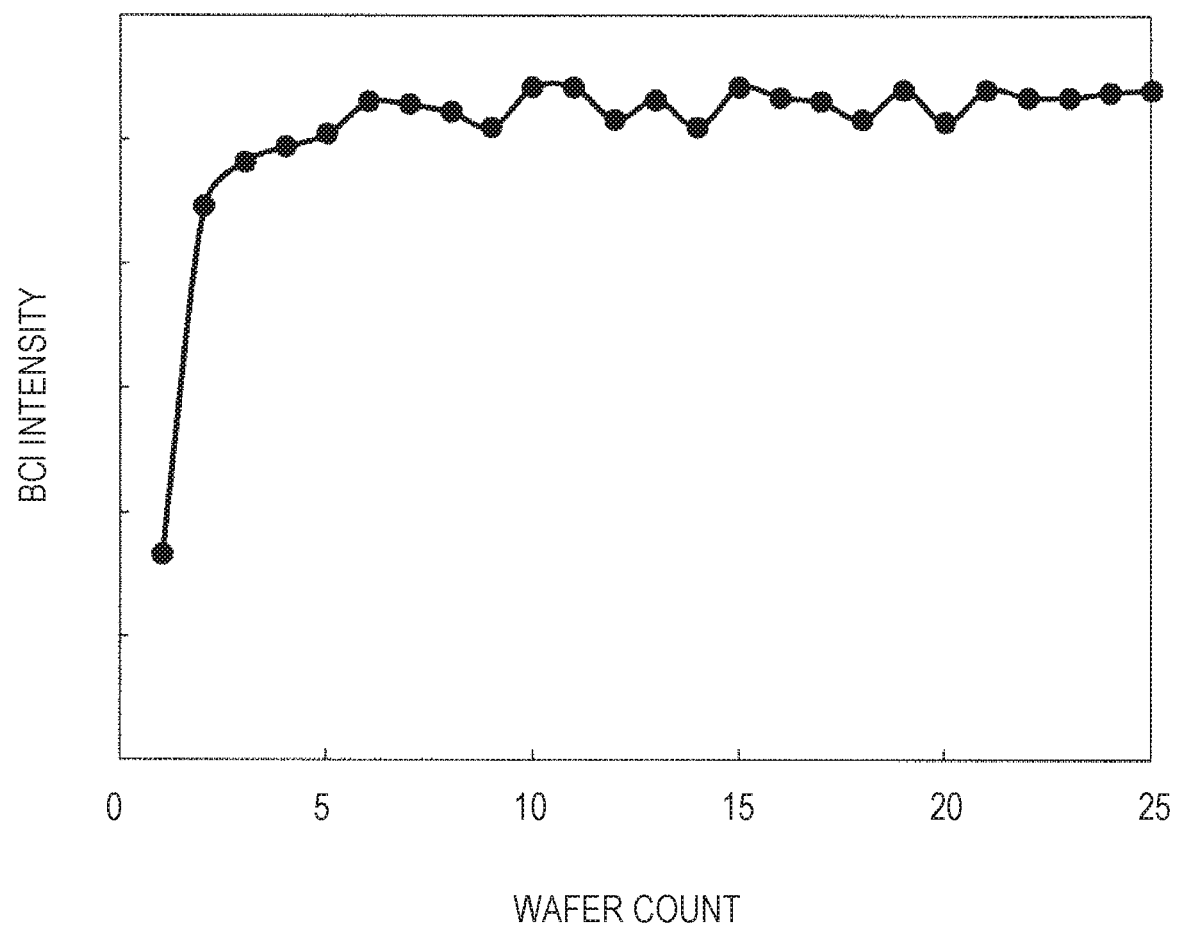
FIG. 7 shows the transition of the luminescence intensity of BCl with respect to the number of workpieces to be treated according to the conventional plasma processing method.

In the transition of the luminescence intensity of BCl with respect to the number to be treated of the workpieces during the etching processing of the workpieces each including the TiN film, the luminescence intensity of BCl tends to be increased with the increase in the number to be treated of the workpieces each including the TiN film as shown in FIG. 7. From the results of FIGS. 6 and 7, it is considered that a boron element-containing compound such as a boron oxide ($B_2O_3$)-containing compound or a boron nitride (BN)-containing compound is subgenerated after the metal cleaning after the etching of the workpiece including the TiN film, and deposited on the workpiece including the TiN film, which causes a decrease in the etching rate of TiN.

From the results of FIGS. 4 to 7, it is found that the transition of the etching rate of the TiN film with respect to the number to be treated intercorrelates with the luminescence intensity of BCl. Therefore, it is found that it is important to remove the boron element-containing compound remaining in the processing chamber before the workpiece on which the metal element-containing film is disposed is etched in order to stabilize the etching rate of the TiN film with respect to the number to be treated. Furthermore, it is also found that "plasma cleaning for removing a boron element-containing compound (steps 304 and 310)" is effective for the stabilization of the etching rate of the TiN film with respect to the number to be treated.

As described above, by carrying out the plasma processing shown in FIG. 3, the surface state of the members in the processing chamber 101 is restored per workpiece, and is adjusted so as to be suitable for the processing, and thereby the processing generating less amounts of the foreign substances can be performed with high reproducibility. Furthermore, according to the present Example, the variation of states of the inside of the processing chamber 101 is suppressed before and after periodical maintenance such as cleaning of the inside of the processing chamber 101 or exchange of parts and between successive lots, and thereby the plasma processing having high reproducibility can be achieved. According to the present Example, the adverse influence of the residue in the processing chamber 101 on the plasma processing is reduced, and the partial pressure of the gas in the processing chamber 101 and the state of the surface of members in the processing chamber are stabilized. Consequently, changes in characteristics such as a plasma processing rate can be suppressed to suppress changes in the worked shape, which can provide an improvement in the accuracy of etching working.

Thus, according to the present Example, it is possible to suppress the adverse influence caused by the fact that as the number to be treated increases or the processing proceeds, the state of the inner wall of the processing chamber 101 changes with time, and the adverse influence being exemplified by the generation of the foreign substances from the inner wall of the processing chamber 101, the reduction in uniformity of the results of treating the workpiece 112, or the change in characteristics such as a treating rate or reproducibility of worked shape. This can provide improvements in the reproducibility of the etching processing and the yield ratio.

Microwave ECR plasma is used for the plasma source in the present Example, but the present invention can also be applied to a plasma processing provided by a plasma processing apparatus using a plasma source such as induction coupling plasma, capacitor coupling plasma, or helicon wave plasma.

Furthermore, in the present Example, the case where a $Cl_2$ gas is used in "plasma cleaning for removing a boron element-containing compound (steps 304 and 310)" has been described. However, a chlorine element-containing gas such as an $SiCl_4$ gas or an HCl gas may be used as the present invention in addition to the $Cl_2$ gas. The present Example has been described using the workpiece containing the TiN film as the workpiece. However, in the present invention, a film containing a metal element such as Ti, Ta, Mo, or Re may be disposed in the workpiece.

What is claimed is:

1. A plasma processing method for subjecting a sample on which a metal element-containing film is disposed to plasma etching in a processing chamber, the method comprising:
    a first step of subjecting an inside of the processing chamber to plasma cleaning using a boron element-containing gas;
    a second step of subjecting the inside of the processing chamber to plasma cleaning using a chlorine gas after the first step;
    a third step of subjecting the inside of the processing chamber to plasma cleaning using a fluorine element-containing gas after the second step;
    a fourth step of depositing a chamber wall-deposited film in the processing chamber by plasma using a silicon element-containing gas after the third step; and
    a fifth step of subjecting the sample to plasma etching after the fourth step,
    wherein the first step, the second step, and the third step are sequentially carried out after the first step to the fifth step are sequentially repeated for each of a number of samples of a lot until all samples of the lot are subjected to plasma etching, and
    wherein the third step and the fourth step are also performed at the start of processing of each of a plurality of lots, each said lot being detected by a controller configured to recognize an end of lot processing has occurred when a sample is housed at an original position of a sample storage container, before the inside of the processing chamber is subjected to etching of any sample of each said lot, so that an etching rate does not decrease as the number of samples of each said lot is processed.

2. The plasma processing method according to claim 1, wherein
    the boron element-containing gas is a boron trichloride gas,
    the fluorine element-containing gas is a nitrogen trifluoride gas, and
    the silicon element-containing gas is a silicon tetrachloride gas.

3. The plasma processing method according to claim 2, wherein the first step further uses a chlorine gas.

4. The plasma processing method according to claim 1, wherein the boron element-containing gas is a boron trichloride gas.

5. The plasma processing method according to claim 1, wherein
    the plasma in the fourth step is generated by using a silicon tetrachloride gas and an oxygen gas.

6. The plasma processing method according to claim 5, wherein
    the plasma in the third step is generated by using a nitrogen trifluoride gas and an argon gas.

7. The plasma processing method according to claim 6, wherein
    the plasma in the first step is generated by using a boron trichloride gas and a chlorine gas.

8. The plasma processing method according to claim 1, wherein
    the plasma in the fourth step is generated by using a silicon tetrachloride gas, an oxygen gas and an argon gas.

9. The plasma processing method according to claim 8, wherein
    the plasma in the third step is generated by using a nitrogen trifluoride gas and an argon gas.

10. The plasma processing method according to claim 8, wherein
    the plasma in the first step is generated by using a boron trichloride gas and a chlorine gas.

* * * * *